United States Patent
Jafarkhani et al.

(10) Patent No.: US 8,594,205 B2
(45) Date of Patent: *Nov. 26, 2013

(54) MULTIPLE DESCRIPTION CODING COMMUNICATION SYSTEM

(75) Inventors: Hamid Jafarkhani, Middletown, NJ (US); Michael T. Orchard, Princeton, NJ (US); Amy R. Reibman, Matawan, NJ (US); Yao Wang, Matawan, NJ (US)

(73) Assignee: AT&T Intellectual Property II, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/869,443

(22) Filed: Oct. 9, 2007

(65) Prior Publication Data

US 2008/0025416 A1    Jan. 31, 2008

Related U.S. Application Data

(60) Continuation of application No. 10/994,511, filed on Nov. 22, 2004, now Pat. No. 7,289,565, which is a division of application No. 09/511,367, filed on Feb. 23, 2000, now Pat. No. 6,823,018.

(51) Int. Cl.
*H04B 14/06* (2006.01)
(52) U.S. Cl.
USPC ............ 375/245; 375/253; 375/246; 375/241
(58) Field of Classification Search
USPC ......... 375/241, 243, 245, 265, 244, 284, 285, 375/246, 253; 704/203, 230; 725/102, 103
See application file for complete search history.

(56) References Cited

U.S. PATENT DOCUMENTS

| | | | |
|---|---|---|---|
| 5,028,995 A | 7/1991 | Izawa et al. | |
| 5,216,503 A * | 6/1993 | Paik et al. | 348/390.1 |
| 5,426,512 A | 6/1995 | Watson | |
| 5,629,780 A | 5/1997 | Watson | |
| 5,717,464 A | 2/1998 | Perkins et al. | |
| 5,724,453 A | 3/1998 | Ratnakar et al. | |
| 5,812,791 A | 9/1998 | Wasserman et al. | |
| 5,850,482 A | 12/1998 | Meany et al. | |
| 6,414,608 B1 * | 7/2002 | Nishida et al. | 341/67 |
| 6,421,468 B1 * | 7/2002 | Ratnakar et al. | 382/254 |
| 6,556,624 B1 | 4/2003 | Orchard et al. | |
| 6,574,372 B2 | 6/2003 | Ratnakar | |
| 7,003,168 B1 | 2/2006 | Chao et al. | |

(Continued)

OTHER PUBLICATIONS

Yang et al "Optimal Subband Filter Banks for Multiple Description Coding", IEEE, Transaction on Information Theory, vol. 46, Nov. 2000.*

(Continued)

*Primary Examiner* — Qutbuddin Ghulamali

(57) ABSTRACT

A method and apparatus reliably encode and decode information over a communication system. The method includes transforming two coefficients into two pairs of random variables, one random variable in each pair having substantially equal energy as one random variable in the other pair. The method further includes quantizing each of the pairs of random variables and entropy coding each quantized random variable separately creating an encoded bitstreams. The encoded bitstreams are received by a decoder which first determines which channels of the communication system are working. The encoded bitstream is entropy decoded, inversed quantized and inversed transformed. An inverse transform performs three different transformations depending upon which channels are working, i.e., whether the first, second or both channels are working.

4 Claims, 11 Drawing Sheets

(56) References Cited

U.S. PATENT DOCUMENTS

| | | |
|---|---|---|
| 7,028,060 B2 | 4/2006 | Daniell |
| 7,289,565 B1 | 10/2007 | Jafarkhani et al. |
| 2001/0016080 A1* | 8/2001 | Goyal et al. .................. 382/251 |

OTHER PUBLICATIONS

Moher et al, "Cross-Entropy and Iterative Decoding", IEEE, Transactions on Information Theory, vol. 44, No. 7, Nov. 1998.*

Kleijn, "On Optimal and Minimum-Entropy Decoding", IEEE, Delft University of Technology, 1997.*

Yang, et al., "Optimal Subband Filter Banks for Multiple Description Coding", IEEE, Transaction of Information Theory, vol. 46, Nov. 2000.

Wang, Yao, et al., "Redundancy rate-Distortion Analysis of Multiple Coding Using Pairwise Correlating Transforms", IEEE Proceedings, 1997.

\* cited by examiner

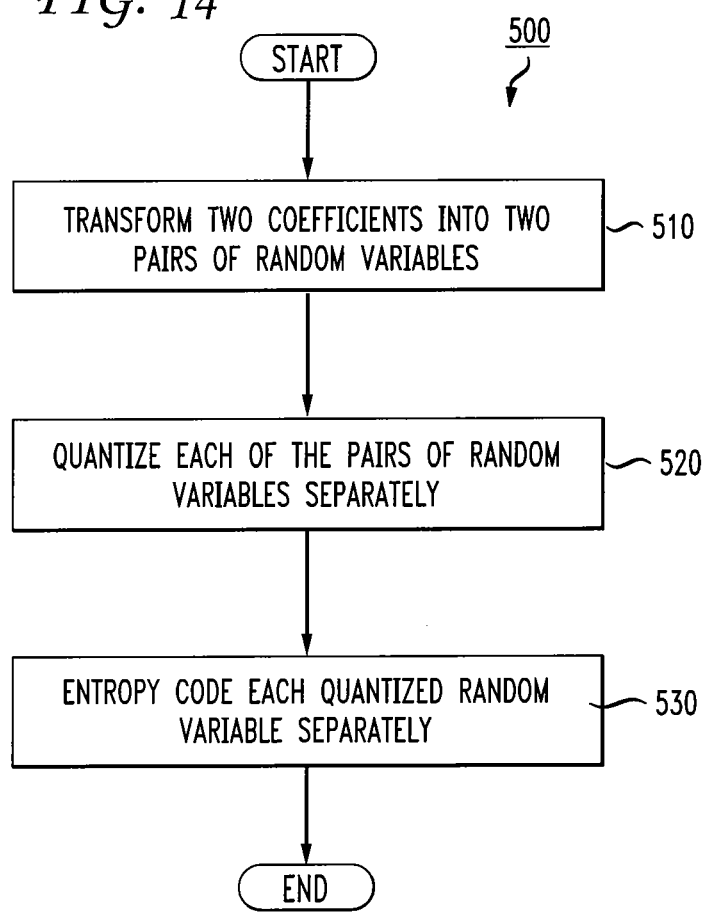

MULTIPLE DESCRIPTION CODING COMMUNICATION SYSTEM

CROSS-REFERENCE TO RELATED PATENT APPLICATIONS

This application is a continuation of U.S. patent application Ser. No. 10/994,511, filed Nov. 22, 2004 now U.S. Pat. No. 7,289,565 entitled Multiple Description Coding Communication System, currently allowed, which is a divisional of U.S. patent application Ser. No. 09/511,367, filed Feb. 23, 2000 entitled Multiple Description Coding Communication System, now U.S. Pat. No. 6,823,018, all of which are herein incorporated by reference in their entirety.

This patent application claims the benefit of U.S. Provisional Application Ser. No. 60/145,937 entitled Multiple Description Coding Communication System, filed Jul. 28, 1999.

This patent application is related to the following commonly assigned U.S. Provisional Patent Application: Method and Apparatus for Accomplishing Multiple Description Coding for Video, U.S. Provisional Application Ser. No. 60/145,852, filed Jul. 27, 1999. This patent application is also related to the following commonly assigned U.S. Patent Application: Multiple Description Coding Communication System, U.S. patent application Ser. No. 08/790,416, filed Jan. 3, 1997.

BACKGROUND OF THE INVENTION

The present invention relates generally to communication systems for processing information, and more particularly to computer-implemented processes and systems for reliably encoding and decoding information over a communication system.

One way to enhance the reliability of a communication system transmitting an information signal is by using multiple description coding (MDC) at a source coder. MDC decomposes the information signal (i.e., input data such as a video stream or an audio stream) into subsignals called samples. Each sample can then be quantized, coded, and transmitted over the communication system in the form of coded bitstreams (referred to as descriptions), via communication channels, independent from the other samples. MDC is designed such that a reconstructed signal can be assembled from any subset of the descriptions. Thus, the reconstructed signal can be assembled with fewer than all of the descriptions. The higher the number of descriptions used in the reconstruction, the higher the quality of the reconstructed signal.

Multiple description coding was first studied from a rate-distortion theory point of view. The motivation behind MDC is to combat signal loss due to path failures. To realize this goal, each coded sample (i.e., description) carries sufficient information about the original signal. Essentially this requires a certain degree of redundancy to be embedded between the multiple descriptions. This reduces coding efficiency compared to conventional signal description coding (SDC) where there is no redundancy. As used herein, the term "coding" and "encoding" are used interchangeably.

Wolf, J. K., Wyner, A., and Ziv, 3., "Source Coding for Multiple Descriptions," *The Bell System Technical Journal*, vol. 59, pp. 1417-1426, October 1980 showed that given $R_1$ and $R_2$ representing the bit rates for two descriptions, respectively, a total bit rate 2R, and $E_2$ ($R_1$, $R_2$) representing a reconstruction error when both descriptions are received, the minimum distortion achievable by a single description coder, $E_{min}$ (2R), is less than the minimal distortion achievable by a multiple description coder when both descriptions are available, $E_2$ ($R_1$, $R_2$), if $R_1+R_2=2R$. Wolf et al. showed this using a rate distortion analysis for an independent identically distributed binary source.

Ozarow, L., "On a Source Coding Problem With Two Channels and Three Receivers," *The Bell System Technical Journal* Vol. 59, p. 1921, December 1980 also showed that the performance of a single description coder is better than the performance of a multiple description coder when both descriptions are available in the case of an independent identically distributed Gaussian source.

Specifically, Ozarow showed that if each coder is optimal in the rate distortion sense, i.e., $E_{1,j}$ ($R_j$) is minimized for a given $R_j$, then the joint coder will be far from optimal, i.e., $E_2$ ($R_1$, $R_2$) is much larger than the minimal distortion achievable for this source $E_{min}$ ($R_1+R_2$). The converse is also true: if the joint coder is optimal, i.e., $E_2$ ($R_1$, $R_2$)≈$E_{min}$ ($R_1+R_2$), then either one of the coders will be far from optimal, i.e., $E_{1,j}$ (R) is much larger than $E_{min}$ (R) for j=1 or j=2 or both.

With real image and video signals, the redundancy in the signal (such as the correlation among adjacent samples) can help reduce the loss in coding efficiency, but a certain amount of sacrifice in coding efficiency is unavoidable. However, this reduced coding efficiency is in exchange for increased robustness to long burst errors and/or channel failures. With SDC, one would have to spend many error-control bits and/or introduce additional latency to correct such channel errors. With MDC, a long burst error or even the loss of one description does not have a catastrophic effect, as long as not all the descriptions are experiencing failures simultaneously. Thus, one could use fewer error control bits for each description. In this sense, the MDC is a way of performing joint source and channel coding.

The first practical multiple description coding was proposed for speech coding. In this approach, a bitstream from a differential pulse code modulation (DPCM) coder is split into even and odd sample packets. If an even (odd) sample packet is lost, data contained in the odd (even) sample packet are used to interpolate the missing even (odd) samples. It was shown that this coder works well beyond what the analysis predicted. This is in part because the analytical results hold true at highly efficient coders while their proposed coder is not efficient. In fact, there is sufficient redundancy left in the coder output, to permit subsampling and high quality interpolation.

In another approach to MDC, multiple descriptions are obtained by quantizing each sample using two quantizers. The quantizers are designed so that the combination of the two quantizers leads to a finer quantizer, while each quantizer itself is a coarse quantizer. The simplest implementation of this approach uses two quantizers whose decision regions shift by half of the quantizer interval with respect to each other. In this case, 2R bits are required to match the performance of a single quantizer with R+1 bits. Therefore, the loss in coding efficiency is quite significant, for the value of R being relatively high. Although more sophisticated quantizer mappings can be designed to improve the coding efficiency, a direct application of this approach to the original samples of a signal is not advisable in terms of loss in coding efficiency. Recently, this approach has been applied to transform coefficients in transform coders, with applications in speech, image, and video. The loss in coding efficiency is less severe in this case, but still quite high, up to 30%.

While offering a good redundancy rate distortion performance at low redundancies, a serious drawback of the two sample transform-based MDC methods is that they fail to reduce one-channel distortion to levels close to two-channel distortion with high redundancies (i.e., near half the total bit rate). This is due to the fact that the two sample transform-based MDC sends one variable on each channel, regardless of the redundancy.

The present invention is therefore directed to the problem of developing a method and apparatus for performing multiple description coding that improves the coding efficiency for a two sample transform.

SUMMARY OF THE INVENTION

The present invention describes a method and apparatus for reliably encoding and decoding information over a communication system. The method includes transforming two samples into two pairs of random variables, one random variable in each pair having substantially equal energy as one random variable in the other pair. The method further includes quantizing each of the pairs of random variables separately and entropy coding each quantized random variable separately creating encoded bitstreams. The encoded bitstreams are received by a decoder which first determines which channels of the communication system are working. The encoded bitstreams are entropy decoded, inversed quantized and transformed. The inverse transformation performs three different transformations depending upon which channels are working, i.e., whether the first, second or both channels are working.

BRIEF DESCRIPTION OF THE DRAWINGS

FIG. 14 depicts an exemplary embodiment of the method according to the present invention.

DETAILED DESCRIPTION

The present invention modifies a conventional transform coder to a multiple description coding (MDC) encoder. Given a block of L samples created from a input signal as in a conventional transform coder, these samples are first transformed into a block of L coefficients using a Discrete Cosine Transform (DCT), for example. It is possible, however to use other types of transforms. Instead of directly quantizing and coding this block of coefficients, the present invention transforms the block of L coefficients into L/2 pairs of random variables. Each pair of random variables is then quantized. After quantization, each random variable is separately encoded and again paired for bitstream formation and transmission. Ideally, the conversion is such that if both bitstreams are received, then the original transform coefficients can be recovered perfectly in the absence of the quantization error. If only one bitstream is received, the original transform coefficients can still be recovered to a certain degree of accuracy.

In an alternative embodiment of the present invention, the block of L samples are not transformed by a DCT. Thus, the L block of samples would be directly transformed into L/2 pairs of random variables.

Figure 1:
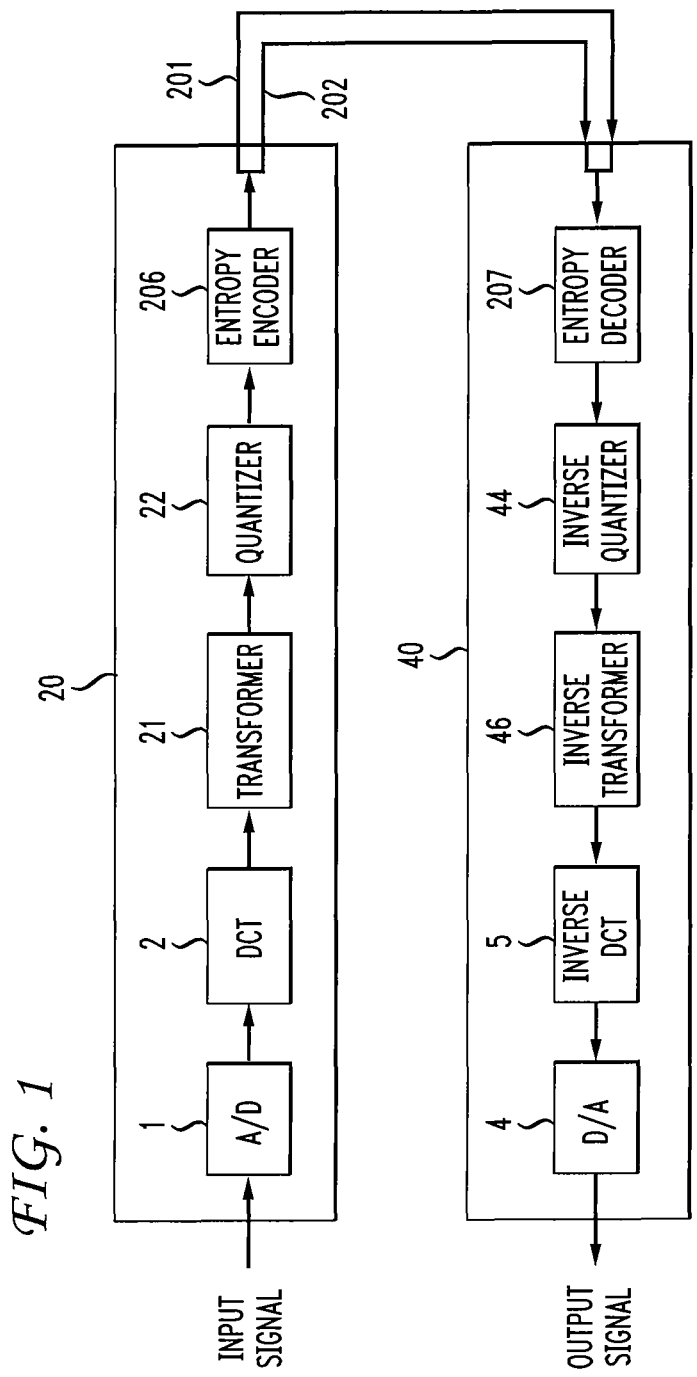
FIG. 1 is a block diagram of a coding/decoding system according to an embodiment of the present invention.

FIG. 1 is a block diagram of a coding/decoding system according to an embodiment of the present invention. The system includes a MDC encoder 20 provided in communication with a multiple description decoder (MDD) 40 over channels 201 and 202. MDC encoder 20 includes one or more of the following components: an analog to digital (A/D) converter 1, a Discrete Cosine Transformer (DCT) 2, a MDC transformer 21, a quantizer 22 and an entropy coder 206.

As shown in FIG. 1, MDC encoder 20 receives an information signal such as video or audio data stream. The information signal is forwarded to A/D converter 1. A/D converter 1 converts the time- and amplitude continuous information signal to a time- and amplitude-discrete signal. Known sampling techniques are also performed on the converted information signal creating samples of the information signal.

These samples are presented to DCT 2. DCT 2 transforms the samples into coefficients. According to an embodiment of the present invention, the coefficients are then transformed into random variables by MDC transformer 21. These random variables are further processed by quantizer 22 and entropy encoder 206 before being transmitted over channels 201 and 202. MDC encoder 20 generates coded bitstreams of the original information signal and outputs the coded bitstream to channels 201 and 202. Channels 201 and 202 may be a communication link, such as those provided by telecommunications networks or computer networks. The MDC4 40 retrieves the coded information data from channels 201 and 202. MDC4 40 inverts the encoding process performed by MDC encoder 20 using entropy decoder 207, inverse quantizer 44 inverse transformer 46, inverse DCT 5 and D/A converter 4 to reconstruct the original information signal. Depending upon the coding/decoding techniques used, the reconstructed information signal may be either an exact replica or merely a close approximation of the original information signal.

Two-Variable Multiple Description Encoder

Figure 2:
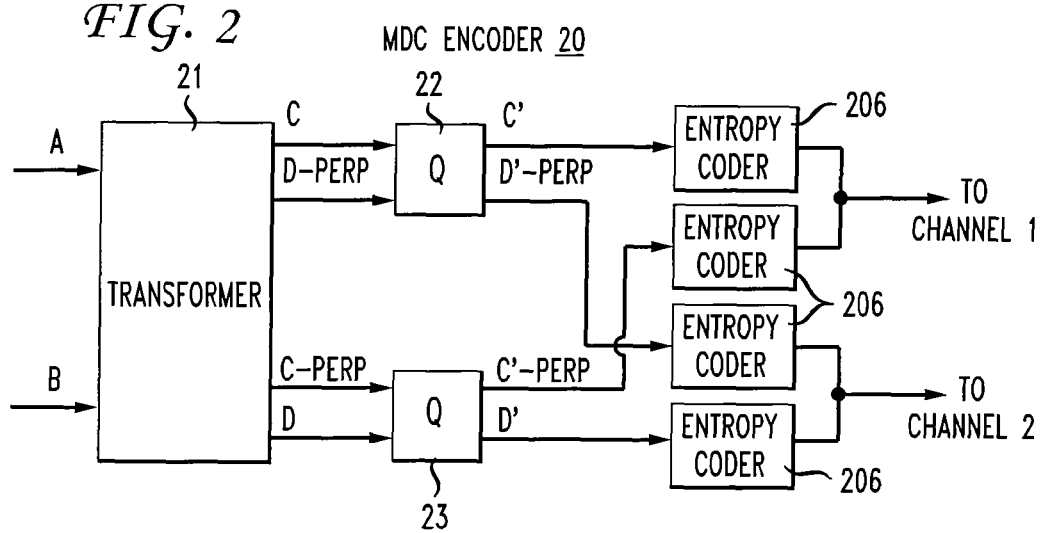
FIG. 2 depicts a block diagram of a multiple description coding (MDC) encoder for two samples according to an embodiment of the present invention.

FIG. 2 depicts a two variable MDC encoder 20 according to an embodiment the present invention. When L=2 (the L samples created from A/D converter 1) coefficients A and B are the resulting coefficients that may have been transformed using DCT 2, but they need not have been first transformed by DCT 2.

In FIG. 2, coefficients A and B enter the MDC transformer 21, which outputs two pair of random variables C, C-perp, D-perp, and D. The two pairs of random variables are formed with C and C-perp being paired and also D and D-perp being paired. One random variable in each pair of random variables has the same energy level as one random variable in the other pair. The details of transform 21 will be discussed later with reference to FIG. 3.

MDC transformer 21 paired outputs are then quantized by quantizers 22 and 23. As shown in FIG. 2, the random variables may be paired such that random variable C and D-perp form one pair and random variables C-perp and D form the other pair. This pairing scheme minimizes quantization error. However, any such pairing of the random variables is contemplated within the scope of the present invention.

As shown, each pair is jointly quantized and produces quantized random variables (C', D'-perp) and (D', C'-perp). These quantized random variables are each individually encoded using a coding technique such as entropy coding, with entropy encoders 24-27. Other encoding technique can also be used. The encoded random variables are paired such the (C', C'-perp) are formatted into a bitstream and sent over channel 1 while the coded random variables (D', D'-perp) are paired and formatted into a bitstream and sent over channel 2. Again, any such pairing of the random variables for transmission is contemplated within the scope of the present invention.

The relationship between the four coded random variables (C̃, C̃-perp) and (D̃, D̃-perp) is as follows:

i) The output pair C' and D', carries all the information needed to reconstruct coefficients A and B in their full (or nearly full) precision.

ii) The output pair C' and D', is constructed to be correlated with each other. This correlation allows one to be estimated from the other when a channel is lost. The correlation between C and D is one way to control the redundancy of the system.

iii) C' and C'-perp (likewise, D' and D'-perp) are uncorrelated variables which without quantization, would fully represent the coefficients A and B. However, in typical usage, the C'-perp (likewise D'-perp) variable will be much more coarsely quantized than the C' variable. Due to i), there is no (or little) need for C'-perp when no channel is lost. Thus, bits spent on C'-perp constitute system redundancy, and coding of C'-perp (likewise D'-perp) provide a second way to control the overall system redundancy.

The general framework described above is used to implement two methods of quantization according to the principles of the present invention.

Figure 12:
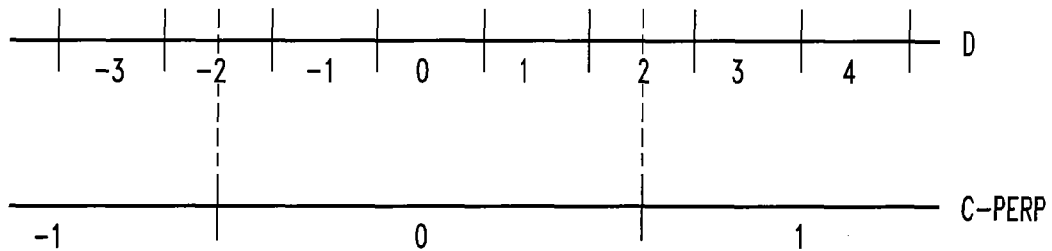
FIG. 12 depicts an example of a quantization scheme according to the principles of the present invention.

The first method of quantization creates variables C', D', C'-perp and D'-perp. The second method of quantization jointly introduces redundancy into the system by correlating C and D and by coding random variables C-perp and D-perp. The purpose of this joint quantization scheme is to allow C'-perp and D'-perp to provide some improvement in reconstruction accuracy in the case when both channels are received. This is in contrast to the first quantization method which only uses C-perp and D-perp when one channel is lost. FIG. 12 illustrates the joint quantization method for C'-perp and D' according to the present invention. Note, C'-perp and D' can be viewed as representing extra information which, along with C', fully represents the coefficients (A,B). When both channels are received, D' is coupled with C' to reconstruct (A,B). One reason for sending C'-perp is to provide some small information about D', even when the channel is carrying D' is lost. As shown in FIG. 12, C'-perp provides much more coarsely quantized information about D̂, even when both channels are received. Consider the example when D'=2. For this case, C'-perp can either equal 0 or 1. For this example, knowledge of C'-perp allows an additional bit of resolution in the representation of D̂. Of course, this improvement would not be realized if D'=0 or D'=1. This improvement (in bits) from the scheme will be (1 bit)*(Probability D in {−2,2,6,10, . . . })

C'-perp and D' need not be coded with scalar quantizers as shown in FIG. 12. Indeed, a range of other methods can be used to allow knowledge of C'-perp to reduce quantization noise of the variable D', when both channels are received.

MDC Transformer

Figure 3:
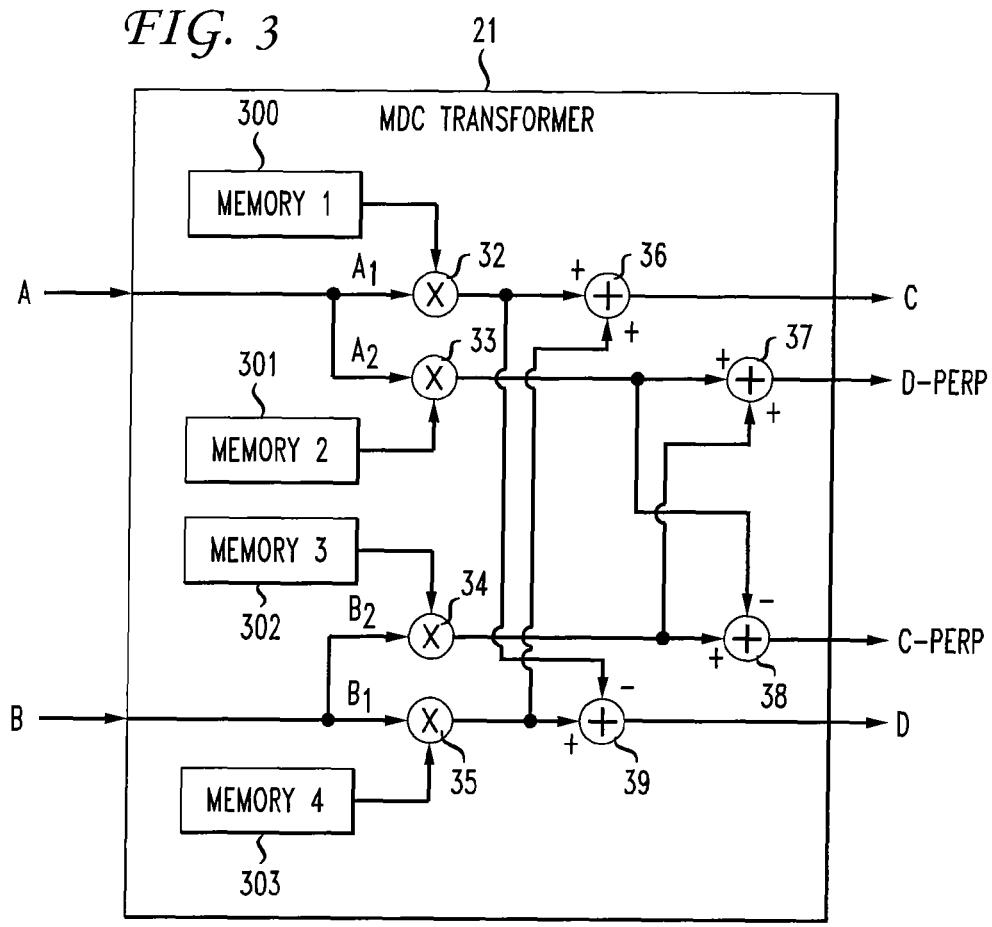
FIG. 3 depicts a block diagram of an MDC transformer used in an embodiment of the present invention.

FIG. 3 depicts MDC transformer 21 according to an embodiment in the present invention. MDC transformer 21 includes multipliers (32, 33, 34 and 35), adders (36, 37, 38 and 39) and memory devices (300, 301, 302 and 303). According to one embodiment of the present invention, coefficients A and B are received by MDC transformer 21. Coefficient A provides the same information to A1 and A2. The information contained in A1 is multiplied by multiplier 32 with a value stored in memory device 300 and the information contained in A2 is multiplied by multiplier 33 with a value stored in memory device 301. Likewise, coefficient B provides its information to both B1 and B2 wherein the information from B1 is multiplied multiplier 35 with a value stored in memory device 303 and information contained in B2 is multiplied by multiplier 35 with a value stored in memory device 302. To form the random variable C, the outputs of the multipliers 32, 35 are input to adder 36 and then are added. To form the random variable D, the outputs of the multipliers 32, 35 are input to adder 39 and are added. To form the random variable C-perp, the outputs of the multipliers 34, 33 are input to adder 38 and are added. Similarly, to form the random variable D-perp, the output of the multipliers 33, 34 are input to adder 37 and are then added.

Figure 4:
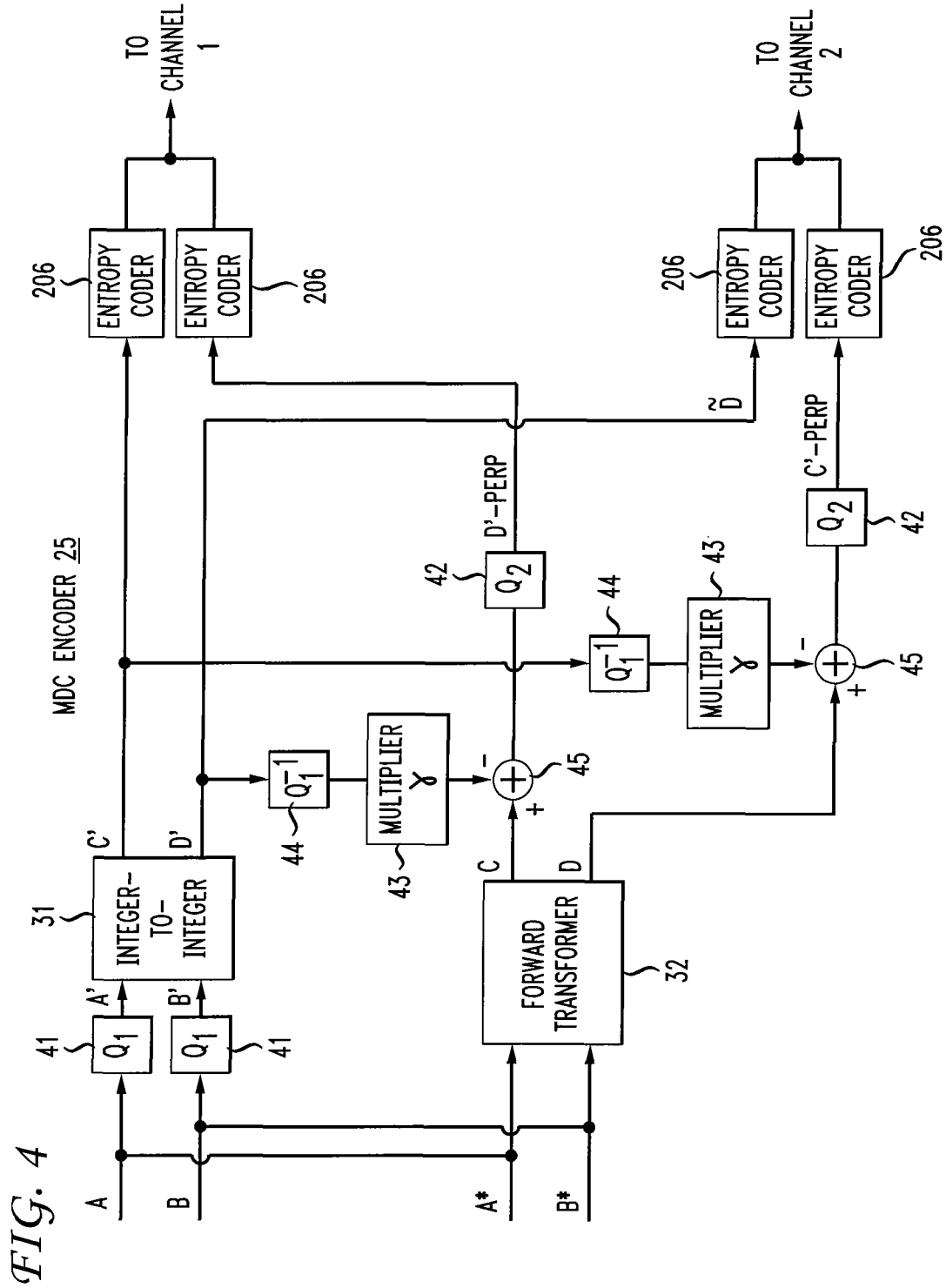
FIG. 4 depicts an alternative embodiment of a MDC encoder for two samples according to an embodiment of the present invention.
Figure 9:
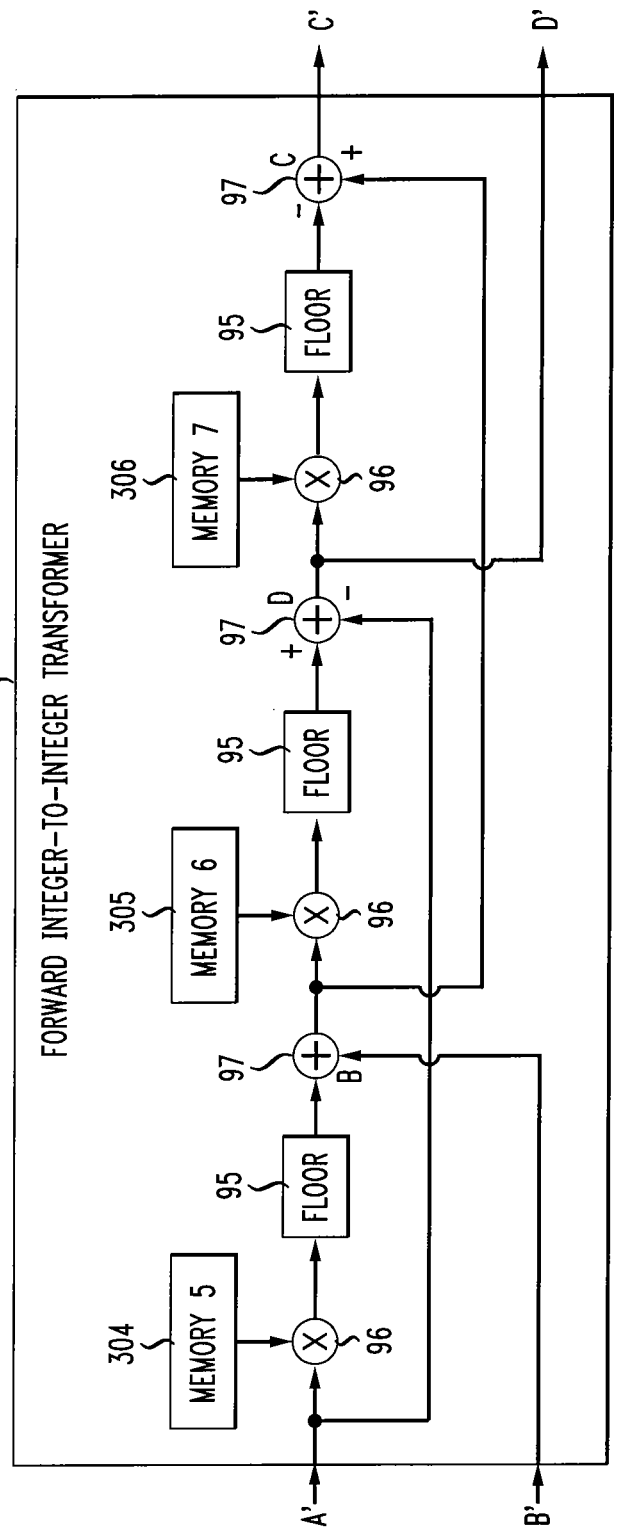
FIG. 9 depicts a block diagram of a forward integer-to-integer transformer according to an embodiment of the present invention.
Figure 10:
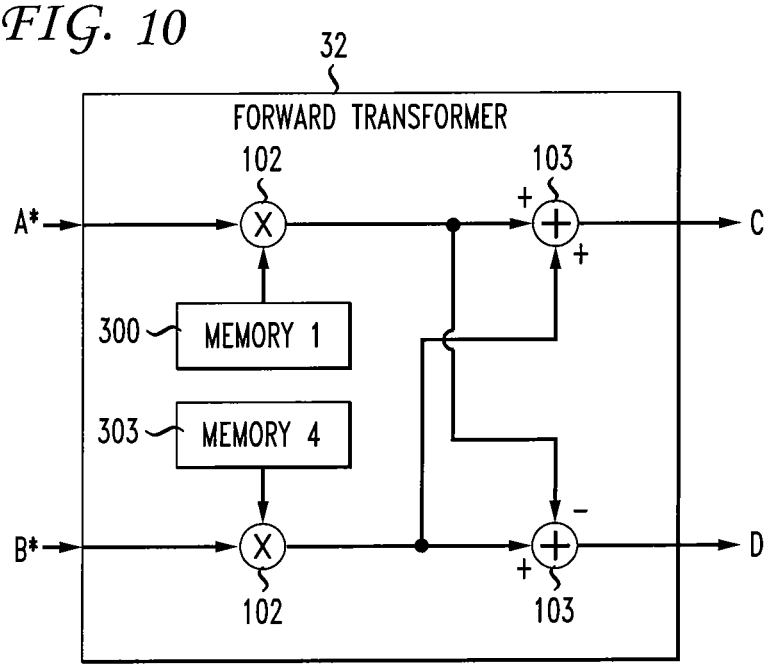
FIG. 10 depicts a block diagram of a forward transformer according to an embodiment of the present invention.
Figure 11:
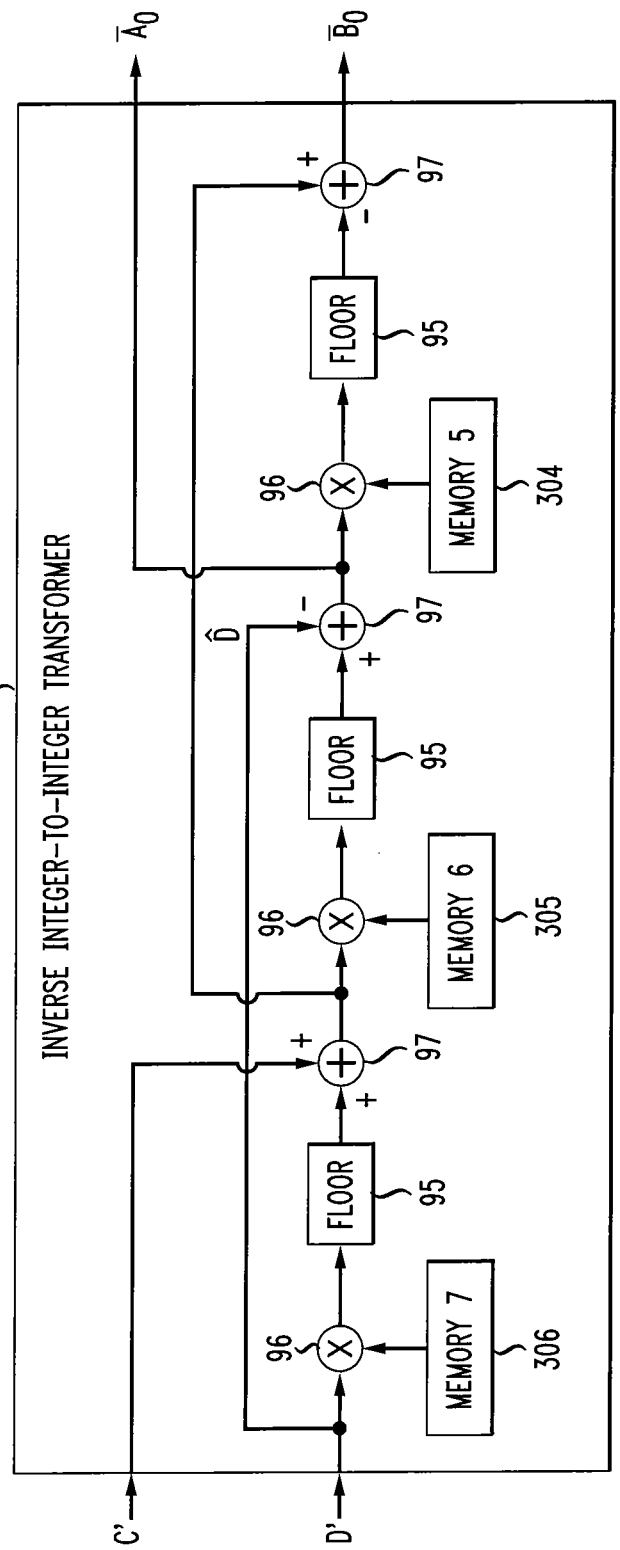
FIG. 11 depicts a block diagram of an inverse integer-to-integer transformer according to an embodiment of the present invention.

FIG. 4 is an alternative embodiment of a MDC encoder according to an embodiment of the present invention. The MDC encoder depicted in FIG. 4 is a joint transform/quantizer MDC encoder. The joint transform/quantizer MDC encoder includes forward integer-to-integer transformer 31, described in full detail with regard to FIG. 9, forward transformer 32, described in full detail with regard to FIG. 10, fine quantizers 41, coarse quantizer 42, multipliers 43, inverse quantizers 44 and adders 45. Coefficients A and B are input into the joint transform/quantizer encoder. Coefficients A and B are sent to fine quantizers 41 and as well as being sent to forward transformer 32. For clarity, coefficients A and B sent to forward transformer 32 will be referred to coefficients A and B, respectively, With respect to coefficients A and B, after quantization, these quantized coefficients are received by integer-to-integer transformer 31. Referring to FIG. 9, integer-to-integer-transformer includes memory devices 91, 92 and 92, floor functions 95, as well as a plurality of adders 97 and multipliers 96. Floor function 95 operates such it converts real numbers into the integer values such that A' and B' are recoverable. Both quantized coefficients are forwarded to transformer 31 and presented to entropy encoders 206 to produce quantized random variables, C' and D', as discussed above in FIG. 2. The value of these coded random variables is as follows:

$$C = \frac{1}{\sqrt{2\beta}} A + \sqrt{\frac{\beta}{2}} B$$

$$D = -\frac{1}{\sqrt{2\beta}} A + \sqrt{\frac{\beta}{2}} B$$

With respect to coefficients A and B, these coefficients are transformed by forward transformer 32 to produce transformed random variables C and D. Random variable C is added to inverse-quantized and γ-multiplied quantized coefficient D'. The output is then sent to coarse quantizer 42 for quantization and entropy coding. Likewise, random variable D is added to inverse-quantized and γ-multiplied quantized coefficient C'. The output is then sent to coarse quantizer 42 for quantization and entropy coding by entropy coder 206. The coded random variables, C-perp and D-perp, as discussed above in FIG. 2 are given as follows:

$$D-perp = \frac{\beta\sqrt{2\beta\sigma_B^2}}{\sigma_A^2 + \sigma_B^2\beta^2} A + \frac{\sqrt{2\beta\sigma_A^2}}{\sigma_A^2 + \sigma_B^2\beta^2} B$$

$$C-perp = -\frac{\beta\sqrt{2\beta\sigma_B^2}}{\sigma_A^2 + \sigma_B^2\beta^2} A + \frac{\sqrt{2\beta\sigma_A^2}}{\sigma_A^2 + \sigma_B^2\beta^2} B$$

wherein two coefficients, A and B are uncorrelated, with zero means and variances $\sigma_A^2$ and $\sigma_B^2$.

As described above, a basic constituent of MDC of the present invention is the coding coefficients. Instead of coding the two coefficients independently, they are each transformed into two random variables, which are quantized separately, encoded and transmitted. In the receiver, if both transformed pairs of variables are available, they are inversely transformed to recover the two coefficients. If only one transformed pair of variables is received, one must be able to estimate the two coefficients.

Redundancy Allocation

Redundancy is due to the increased cost in bit rate for coding correlated pairs (C, C-perp) and (D, D-perp). One channel distortion is reduced because the correlation between (C, C-perp) and (D, D-perp) allows a lost channel to be estimated from the other when one channel is received. C and D are correlated and increase the redundancy and C-perp and D-perp are also correlated, but they increase the redundancy because they are typically not needed if both channels are recovered.

Figure 13:
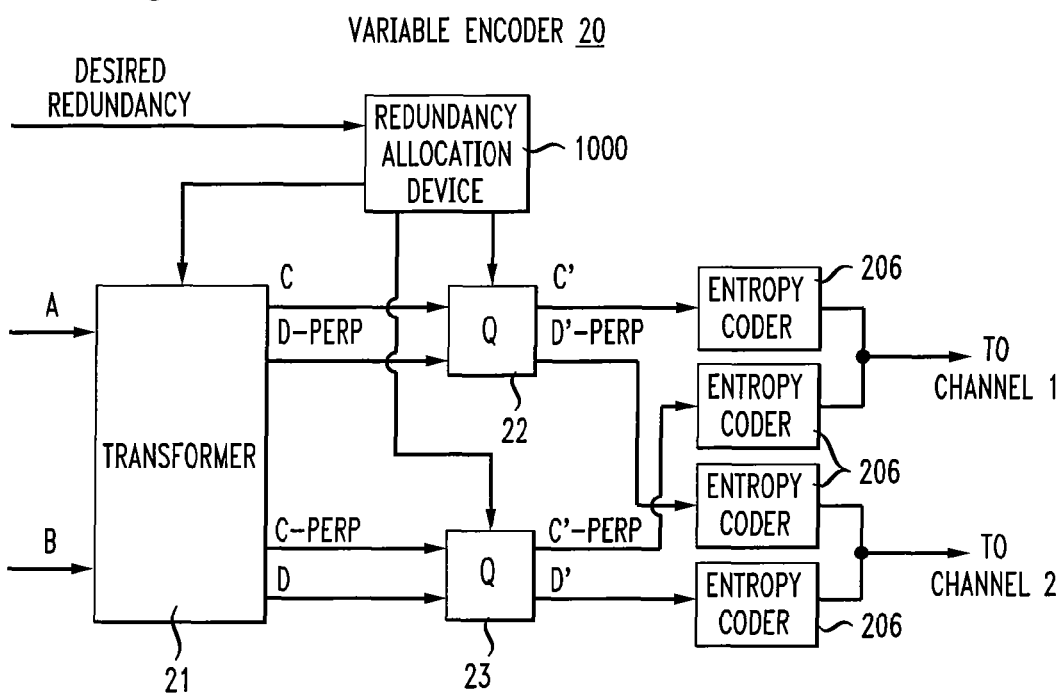
FIG. 13 depicts a block diagram of the MDC encoder according to an alternative embodiment of the present invention.

FIG. 13 illustrates a block diagram of the MDC encoder according to an alternative embodiment of the present invention. In this embodiment, redundancy allocation device 1000 is included to receive an indication of the amount of redundancy desired. The output of redundancy device 1000 is sent to MDC transformer 21 and quantizers 22 and 23 for processing. The desired redundancy is used to construct bitstreams having the optimal redundancy for reconstruction of the original information signal.

All approaches to MDC involve creating redundancy in the bitstreams transmitted over the different channels. However, redundancy can take on many forms, and may be difficult to quantify and compare. For example, simple replication of a bit on two channels and the creation of obscure relationships between the bits on two channels each create redundancy between the bitstreams. In the first case, it is easy to count the number of replicated bits, while in the second case, it may be unclear how to quantify redundancy.

The MDC encoder jointly minimizes two distortion measures:

$D_0$: the distortion of the two-channel reconstruction; and
$D_1$: the average distortion of the one-channel reconstruction given equi-probable loss of either channel.

The coder minimizing only $D_0$ is a single description decoder and its performance is characterized by rate-distortion function of the source. Redundancy is the bit rate sacrificed compared to the "$D_0$-only" coder, for the purpose of lowering $D_1$. More precisely, the redundancy in coding a source Y at a two-channel distortion $D_0$, is the difference, $\rho = R - R^*$, between the total transmitted bitrate R and $R^* = R_Y(D_0)$, the source rate-distortion function evaluated at $D_0$. $R^*$ is the lowest rate any coder could have used to achieve the same two channel distortion. The purpose of introducing redundancy in a representation is to lower the one-channel distortion $D_1$, and the function $\rho(D_1;D_0)$ denotes the relationship between redundancy and $D_1$. This redundancy rate-distortion function, describes how many bits of redundancy are required by a coder to achieve a desired $D_1$ at a given two-channel distortion $D_0$. Likewise, the redundancy rate-distortion rate function $D_1(\rho;D_0)$ describes the achievable one-channel distortion $D_1$ for a given redundancy p and two-channel distortion $D_0$.

According to the example described above, redundancy is due to the increased cost in bitrate for coding the correlated pairs. One channel distortion is reduced because the correlation between C and D and C-perp and D-perp allows a lost channel to be estimated form the other when only one channel is received.

The redundancy allocation for the example above, using the transformation equations for C and D yields:

$$\rho = \log_2 \frac{\sigma_C \sigma_D}{\sigma_A \sigma_B}$$

where:

$$\sigma_C^2 = \frac{1}{2\beta} \sigma_A^2 + \frac{\beta}{2} \sigma_B^2 = \sigma_D^2$$

C and C-perp are uncorrelated, that is the expected value E(C*C-perp)=0. Likewise, D and D-perp are also uncorrelated having an expected value E(D*D-perp)=0.

If desirable, the desired redundancy p is less than $$\rho = \log_2 \frac{r^2 + 1}{2r}$$

$$r^2 = \frac{\sigma_A^2}{\sigma_B^2}$$

then the optimal thing to do is not the send C-perp and D-perp. Apply all redundancy ρ to C and D. Else use ρ* redundancy for C and D and use the remaining redundancy for C-perp and D-perp.

For a given ρ;

$$\beta = \sqrt{\frac{\frac{\sigma_A}{\sigma_B} \times 2^{2\rho}\left(1 - \sqrt{(1 - 2^{-4\rho})}\right)}{2}}$$

Multiple Description Decoder (MDD)

Consider the coding and transmission of A and B through two independent and equal channels. A and B are coded and transmitted independently. If one channel undergoes a failure so that A or B is lost, because A and B are independent, the best estimate of A or B is by the respective mean, and the corresponding estimation error is $\sigma_A^2$ or $\sigma_B^2$. If one coefficient, for example A, has a significantly higher variance than B, then the failure of the channel carrying A will lead to a large error.

As stated above, coefficients A and B are transformed into random variables C, C-perp and D, D-perp using the unitary transform described above. If both C', C'-perp and D', D'-perp are received, the inverse is simply:

$$\overline{A} = \sqrt{\frac{B}{2}}(C-D)$$

$$\overline{B} = \frac{1}{\sqrt{2B}}(C+D)$$

If only C, C-perp or D, D-perp are received, then estimators can be used to estimate A and B. The best linear estimator for D given C is $$\tilde{C} = \gamma D + D\text{-perp}$$

and the best linear estimator for C given D is $$\tilde{D} = \gamma C + C\text{-perp}$$

if all C, C-perp, D and D-perp are received in the absence of quantization, then $\tilde{C}=C$ and $\tilde{D}=D$.

The coder which codes C-perp and D-perp is referred to as the four variable multiple description decoder (MDD).

Figure 5:
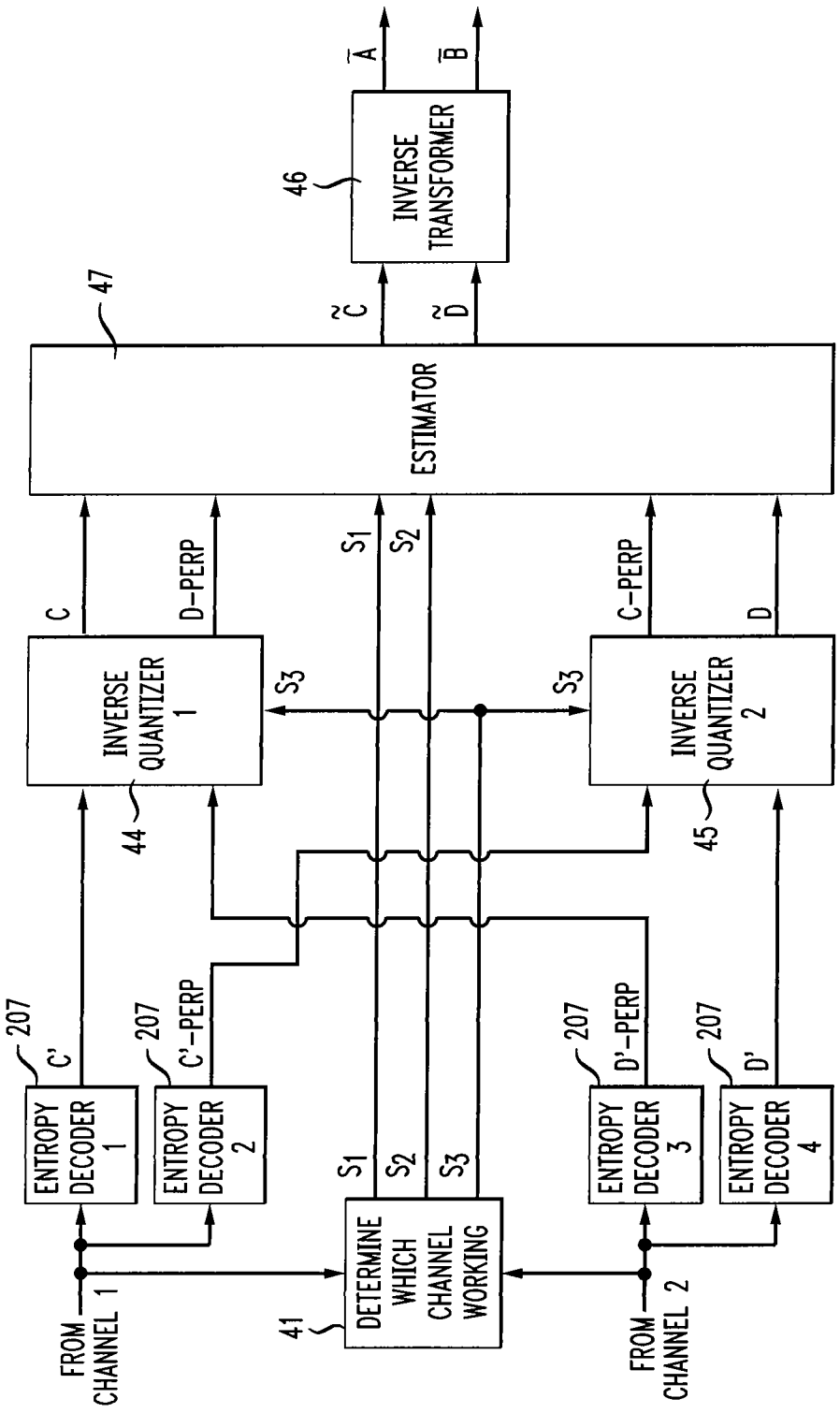
FIG. 5 depicts a block diagram of a multiple description decoder according to an embodiment of the present invention for use with the MDC encoder of FIG. 2.

FIG. 5 depicts a Multiple Description Decoder (MDD) 40 according to an embodiment of the present invention. The decoder 40 is used to decode the encoded bitstreams from MDC encoder 20 shown in FIG. 2.

First, the block "Determine which channels working" 41 determines whether channel 1, channel 2, or both are working by monitoring their inputs to the decoder 40. One possible embodiment for performing this function is to monitor the channel for the incoming error rate. For example, the device monitors the incoming bit stream to determine if the error rate is in excess of a predetermined value, for example, to make the decision whether the input is working or not. If the error exceeds the predetermined threshold, then the device determines that the input is not working and sets the switches as described below. If the error is within the predetermined threshold, then the device determines that the input is working and sets the switches as described below. Alternate embodiments for performing this function are well-known in the art, and could easily be implemented by one of skill in the art.

Figure 6:
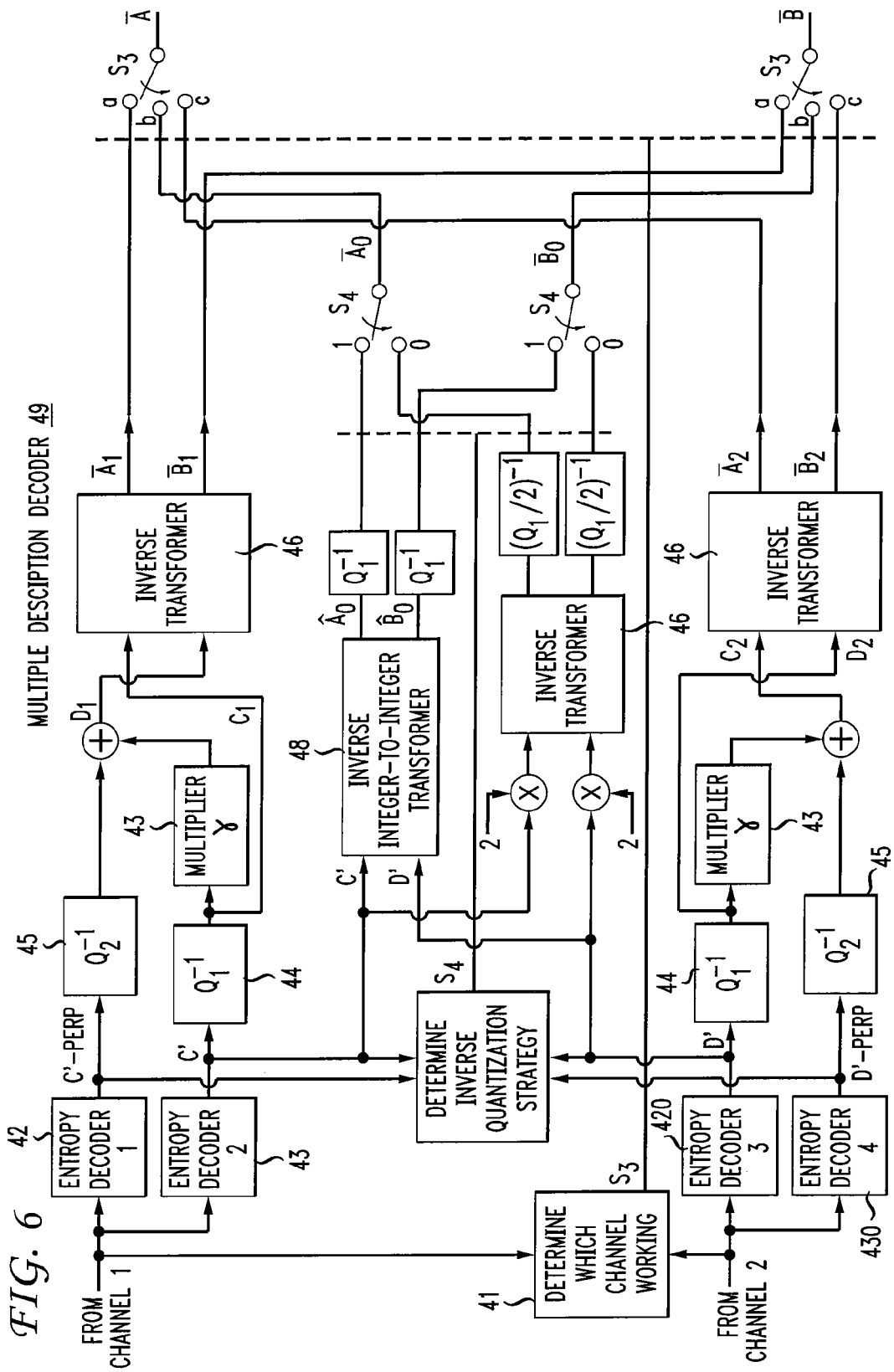
FIG. 6 depicts block diagram of an alternative embodiment of a multiple description decoder according to an embodiment of the present invention for use with the MDC encoder of FIG. 4.

Referring to FIG. 6, the inputs from each channel are entropy decoded using standard entropy decoders 42, 43, 420 and 430. The outputs of the entropy decoders 42, 43, 420 and 430 are inverse quantized by inverse quantizers 44, 45, respectively, to obtain random variables C, D, C-perp and D-perp. Inverse quantizer 45 takes as input D', C'-perp and switch values S1, S2 and S3. If S3=c (channel two is only working), inverse quantizer 45 outputs D as the inverse quantization of $\tilde{D}$. If S3=A (channel one is only working), inverse quantizer 45 outputs C-perp as the inverse quantization of $\tilde{C}$-perp. If S3=b (both channels are working), the inverse quantizer 45 outputs a value for D that is consistent with the principles of inverse quantization and the quantization intervals, illustrated in FIG. 12. For example, according to the illustration in FIG. 12, suppose C'-perp takes the value 1 and D' takes the value 2. The output D of inverse quantizer 45 with S3=b is a value midway between the interval consistent with both D'=2 and C'-perp=1. Inverse quantizer 44 operates in a similar manner is that discussed above with respect to inverse quantizer 45.

Figure 7:
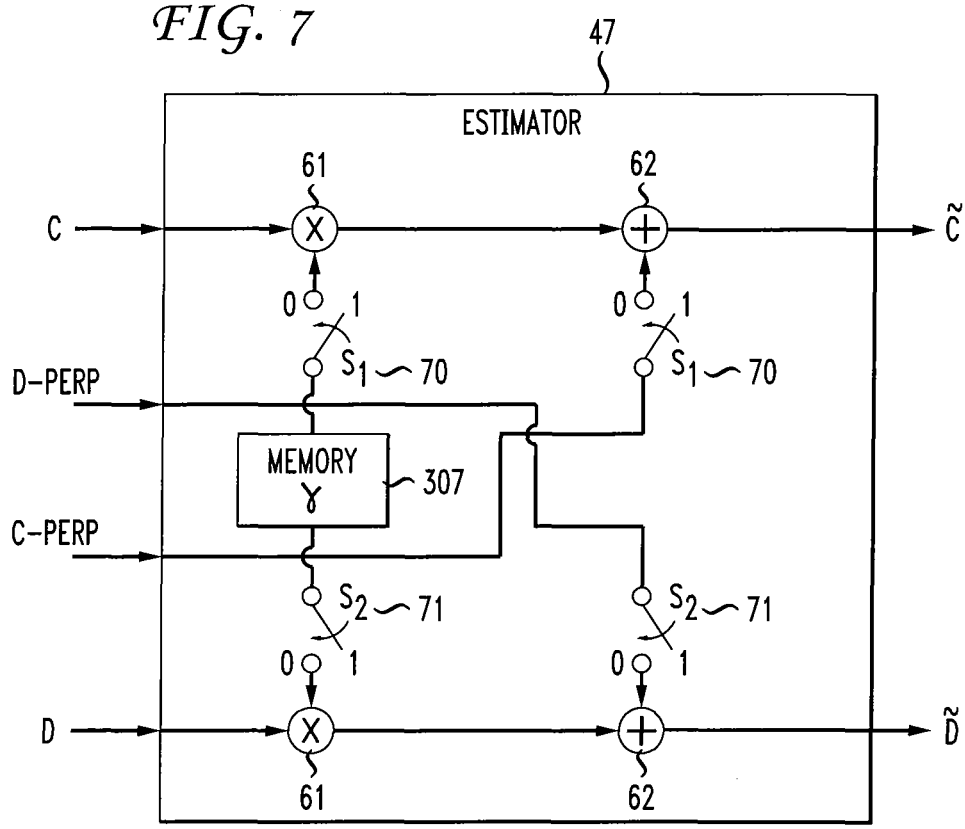
FIG. 7 depicts a block diagram of an estimator according to an embodiment of the present invention.
Figure 8:
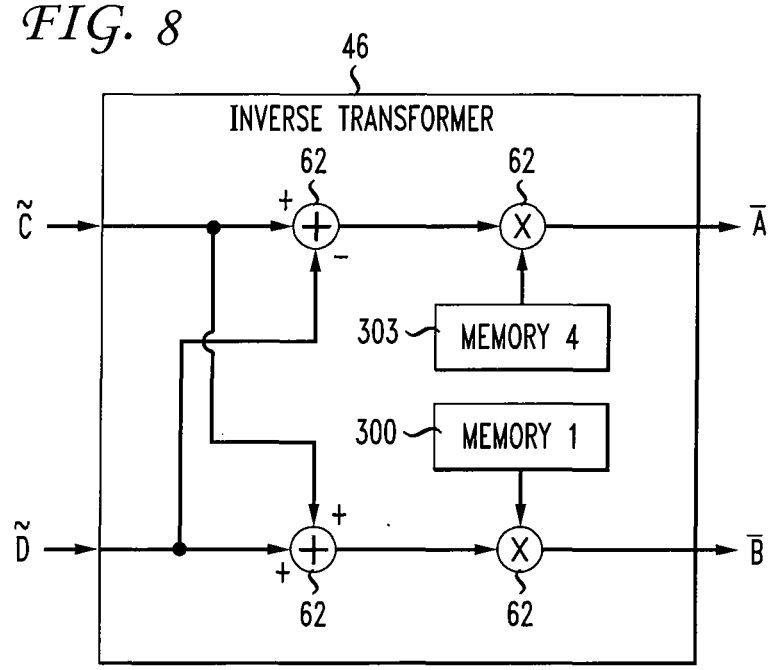
FIG. 8 depicts a block diagram of an inverse transformer according to an embodiment of the present invention.

After processing by inverse quantizer 44 and 45 the random variables C, D, C-perp and D-perp as well as S1 and S2 then enter the an Estimator 47 which is shown in detail in FIG. 7. Estimator 47 includes memory 8, multipliers 61 and adders 62. After processing by estimator 47, the random variable are forwarded to inverse transformer 46, shown in detail in FIG. 8 which produces outputs $\overline{A}$ and $\overline{B}$. Referring to FIG. 8, inverse transformer 46 includes memory 4, 303, memory 1, 300 as well as adders 62 and multipliers 61.

Switches S1, S2, and S3 are set according to the determination, as indicated in Table 1. If both inputs are received (C' and D'), the switch $S_1=1$, $S_2=1$, and $S_3=b$. On the other hand, if only one input is received, then the switch corresponding to that input is set to zero, i.e., if only C' is received then $S_1=0$ and $S_3=a$, and if only D' is received then $S_2=0$ and $S_3=c$.

TABLE 1

|  | $S_1$ | $S_2$ | $S_3$ |
|---|---|---|---|
| C' and D' | 1 | 1 | b |
| C' only | 0 | — | a |
| D' only | — | 0 | c |

The eight memory locations 300-307 are initialized at the values shown in Table 2.

TABLE 2

| Memory Location | Values Stored in Memory Locations |
|---|---|
| 1 | $\frac{1}{\sqrt{2\beta}}$ |
| 2 | $\frac{\beta\sqrt{2\beta\ \sigma_B^2}}{\sigma_A^2 + \sigma_B^2\beta^2}$ |
| 3 | $\frac{\sqrt{2\beta\ \sigma_A^2}}{\sigma_A^2 + \sigma_B^2\beta^2}$ |
| 4 | $\sqrt{\frac{\beta}{2}}$ |
| 5 | $\sqrt{2\beta}\left(1 - \sqrt{\frac{\beta}{2}}\right)$ |
| 6 | $\frac{1}{\sqrt{2\beta}}$ |
| 7 | $\sqrt{2\beta} - 1$ |
| 8 | $\gamma$ |

As shown in FIG. 7, Estimator 47 receives as input C, D-perp, C-perp and D. Depending on the position of switches $S_1$ (either 0 or 1) (switch $S_1$ is shown as elements 70 for simplicity), the value C is either multiplied by the values in memory location 8 (elements 307) and added to C-perp or simply outputted, respectively. Similarly, depending on the position of switch $S_2$ (either 0 or 1) (switch S2 is shown as elements 71 for simplicity), the value D is either multiplied by the value in memory location 8 (element 307) and added to D-perp or simply outputted, respectively.

The outputs of Estimator 47 are presented to inverse transformer 46. The output of inverse transformer yields coefficients $\hat{A}$ and $\hat{B}$.

FIG. 6 depicts block diagram of an alternative embodiment of MDD4 49 according to an embodiment of the present invention for use with the coder of FIG. 4. As in FIG. 5, the decoder in FIG. 6, determines which channel is working using Determine Which Channel is Working 41. After determining which channel is working, the bitstreams are then entropy decoder with entropy decoders 42, 43, 420 and 430. Determine Inverse Quantization Strategy block 60 takes and inputs the values of C', C'-perp, D', and D'-perp and outputs signal S4 indicating whether either D'-perp or C'-perp refine the information known about C or D, respectively. If either if refined, then signal S4 is 0. If neither is refined, then signal S4 is 1.

Inverse quantizer 44 accepts signal S1 and values C' and D'-perp, and outputs C and D-perp. D-perp is ignored, and C is sent to Inverse Transformer 46. Inverse Quantizer 45 accepts signal S2 and values C'-perp and D', and outputs C-perp and D. C-perp is ignored and D is sent to Inverse Transformer 46 for processing. The output renders:

$$\overline{A} = \sqrt{\frac{\beta}{2}}(C-D)$$

$$\overline{B} = \frac{1}{\sqrt{2\beta}}(C+D)$$

FIG. 14 depicts an exemplary embodiment of the method according to the present invention. The method starts at step 500. Two coefficients are transformed into two pairs of random variables at step 510. One random variable is each pair has substantially the equal energy as one random variable in the other pair.

In step 520, each of the pairs of random variables is separately quantized. Finally, each quantized random variable is entropy encoded separately at step 530.

The present invention provides a method for performing multiple description coding that improves the coding efficiency of an input signal. The method includes transforming two samples into two pairs of random variables, one random variable in each pair having substantially equal energy as one random variable in the other pair. The method further includes quantizing each of the pairs of random variables and entropy coding each quantized random variable separately creating encoded bitstreams. The encoded bitstreams are received by a decoder which first determines which channels of the communication system are working. The encoded bitstreams are entropy decoded, inversed quantized and transformed. The inverse transformation performs three different transformations depending upon which channels are working, i.e., whether the first, second or both channels are working.

Although the present invention has been described in detail, those skilled in the art should understand that they can make various changes, substitutions and alterations herein without departing from the spirit and scope of the invention in its broadest form.

What is claimed is:

1. A method for decoding a bitstream received over two channels using multiple description coding, comprising:
   determining which of the two channels are working, wherein the determining comprises monitoring the two channels for an incoming error rate;
   entropy decoding outputs from the two channels separately;
   inverse quantizing the outputs; and
   inverse pairing and transforming the outputs using information regarding which channels are working, wherein the inverse pairing and transforming comprises transforming the outputs into two coefficients using a unitary transform.

2. An apparatus for decoding a bitstream received over two channels using multiple description coding, comprising:
   a multiple description decoder configured to:
   determine which of the two channels are working, by monitoring the two channels for an incoming error rate;
   entropy decode outputs from the two channels separately;
   inverse quantize the outputs; and
   inverse pair and transform the outputs using information regarding which channels are working, by transforming the outputs into two coefficients using a unitary transform.

3. A method for decoding a bitstream received over two channels using multiple description coding, comprising:
   determining whether one of the two channels is working, wherein the determining comprises monitoring the two channels for an incoming error rate;
   entropy decoding outputs from the two channels separately;
   inverse quantizing the outputs; and
   inverse pairing and transforming the outputs using information regarding whether the one of the two channels is working, wherein the inverse pairing and transforming comprises transforming the outputs into two coefficients using a unitary transform.

4. An apparatus for decoding a bitstream received over two channels using multiple description coding, comprising:
   a determining module for determining whether one of the two channels is working, by monitoring the two channels for an incoming error rate;
   entropy decoders for entropy decoding outputs from the two channels separately;
   inverse quantizers for inverse quantizing outputs from the entropy decoders;
   an estimator for pairing the outputs from the inverse quantizers using information regarding whether the one of the two channels is working; and
   an inverse transformer for transforming the outputs wherein the inverse transformer transforms the outputs into two coefficients using a unitary transform.

* * * * *